(12) United States Patent
Yamai et al.

(10) Patent No.: US 9,965,124 B2
(45) Date of Patent: May 8, 2018

(54) LIGHT TRANSMITTING ELECTRICALLY CONDUCTIVE MEMBER AND METHOD FOR PATTERNING THE SAME

(71) Applicant: ALPS ELECTRIC CO., LTD., Tokyo (JP)

(72) Inventors: Tomoyuki Yamai, Miyagi-ken (JP); Mitsuo Bito, Miyagi-ken (JP); Yasuyuki Kitamura, Tokyo (JP)

(73) Assignee: ALPS ELECTRIC CO., LTD., Tokyo (JP)

(*) Notice: Subject to any disclaimer, the term of this patent is extended or adjusted under 35 U.S.C. 154(b) by 39 days.

(21) Appl. No.: 15/005,428

(22) Filed: Jan. 25, 2016

(65) Prior Publication Data

US 2016/0139710 A1 May 19, 2016

Related U.S. Application Data

(63) Continuation of application No. PCT/JP2014/068813, filed on Jul. 15, 2014.

(30) Foreign Application Priority Data

Aug. 5, 2013 (JP) .................................. 2013-162020

(51) Int. Cl.
*G06F 3/044* (2006.01)
*G06F 3/041* (2006.01)
(Continued)

(52) U.S. Cl.
CPC .............. *G06F 3/044* (2013.01); *G06F 3/041* (2013.01); *G06F 3/0412* (2013.01); *H01B 1/22* (2013.01);
(Continued)

(58) Field of Classification Search
CPC ...... B32B 7/12; B32B 15/02; B32B 2457/208; G06F 3/044; G06F 3/0418; G06F 2203/04103; G06F 2203/04112
See application file for complete search history.

(56) References Cited

U.S. PATENT DOCUMENTS

2011/0061908 A1 3/2011 Goto et al.
2013/0022914 A1* 1/2013 Tanaka ................. C07D 313/10
430/270.1

(Continued)

FOREIGN PATENT DOCUMENTS

CN 103021532 A 4/2013
CN 103493147 A 1/2014
(Continued)

OTHER PUBLICATIONS

International Search Report for corresponding International Patent Application No. PCT/JP2014/06992, dated Sep. 30, 2014, 5 pages.

*Primary Examiner* — Christopher E Leiby
(74) *Attorney, Agent, or Firm* — Brinks Gilson & Lione

(57) ABSTRACT

A method for patterning a light transmitting electrically conductive member uses a light transmitting laminate material in which an electrically conductive layer including an overcoat layer and silver nanowires embedded therein is formed on a surface of a light transmitting base film and includes a step of treating a surface of the electrically conductive layer which is not covered with a resist layer using an iodine solution to at least partially iodize the silver nanowires and a step of applying a thiosulfate solution to the surface of the electrically conductive layer which is not covered with the resist layer to remove a silver iodide exposed to a surface of the overcoat layer. Since a white cloudy or a whitened silver iodide is removed, the optical transmission characteristics of the non-electrically conductive region can be improved.

25 Claims, 6 Drawing Sheets

(51) Int. Cl.
*H01B 1/22* (2006.01)
*H03K 17/96* (2006.01)

(52) U.S. Cl.
CPC . *H03K 17/962* (2013.01); *G06F 2203/04103* (2013.01); *G06F 2203/04112* (2013.01)

(56) References Cited

U.S. PATENT DOCUMENTS

| | | |
|---|---|---|
| 2013/0078436 A1 | 3/2013 | Katsuyuki et al. |
| 2014/0034360 A1 | 2/2014 | Tanaka et al. |
| 2015/0009432 A1* | 1/2015 | Katagiri .................. G06F 3/041 349/12 |
| 2015/0021156 A1* | 1/2015 | Inoue ...................... G06F 3/044 200/600 |

FOREIGN PATENT DOCUMENTS

| | | |
|---|---|---|
| JP | 2010-507199 A | 3/2010 |
| JP | 2011-060686 A | 3/2011 |
| JP | 2013-073748 A | 4/2013 |
| JP | 2013-137982 A | 7/2013 |
| KR | 20150095247 A | 8/2015 |
| TW | 201303906 A | 1/2013 |
| WO | WO 2012-141058 A | 10/2012 |

\* cited by examiner

LIGHT TRANSMITTING ELECTRICALLY CONDUCTIVE MEMBER AND METHOD FOR PATTERNING THE SAME

CLAIM OF PRIORITY

This application is a Continuation of International Application No. PCT/JP2014/068813 filed on Jul. 15, 2014, which claims benefit of Japanese Patent Application No. 2013-162020 filed on Aug. 5, 2013. The entire contents of each application noted above are hereby incorporated by reference.

BACKGROUND

1. Field of the Disclosure

The present disclosure relates to a light transmitting electrically conductive member and a method for patterning the same.

2. Description of the Related Art

A light transmitting electrically conductive member disposed at a front side of a display panel has been used as an electrostatic touch panel or the like.

In a related art light transmitting electrically conductive member, a light transmitting electrode layer is formed on a surface of a base material from indium tin oxide (ITO). However, this type of metal oxide is disadvantageously weak against a bending stress. In Japanese Unexamined Patent Application Publication No. 2010-507199, a light transmitting electrically conductive layer, which includes a resin layer and a network of electrically conductive nanowires embedded therein has been disclosed. Since being strong against an external physical force, such as a bending stress, the electrically conductive layer described above is suitably used for a light transmitting electrically conductive member, which includes a bending deformable resin film as a base material.

In the electrically conductive layer containing electrically conductive nanowires, a patterning may be performed by an etching step so that a non-electrically conductive region is partially formed by dissolving the electrically conductive nanowires. However, after the patterning is performed, there has been a problem in that between an electrically conductive region in which the electrically conductive nanowires remain and the non-electrically conductive region from which the electrically conductive nanowires are removed, a remarkable difference in optical characteristics is generated.

Accordingly, Japanese Unexamined Patent Application Publication No. 2010-507199 also discloses a step in which the electrically conductive nanowires are partially chemically transformed into non-electrically conductive nanowires or nanowires having a high resistivity. In the step described above, by applying an oxidizing agent to a region, which is required to be non-electrically conductive, silver nanowires are changed into an insoluble metal salt by modification so as to have non-electrically conductive properties.

In an electrically conductive layer including a network of electrically conductive nanowires, in order to ensure the electrical conductivity with a metal layer or the like to be formed on the electrically conductive layer, the nanowires are partially exposed to the surface thereof. Hence, when an oxidizing agent is applied to a region which is required to be non-electrically conductive, the nanowires exposed to the surface of the electrically conductive layer are formed into a metal oxide compound and remain in the form of a white cloudy material, and as a result, a problem in that the optical characteristics of the region which is required to be non-electrically conductive are degraded may arise.

In addition, in Japanese Unexamined Patent Application Publication No. 2010-507199, as the oxidizing agent, an oxide salt, such as a hypochlorite, or an organic oxidizing agent, such as tetracyanoquinodimethane (TCNQ), has been disclosed by way of example. However, those oxidizing agents each have not an adequate degree of permeation into an overcoat layer, which is a resin layer, in which a network of silver nanowires is embedded, and hence, patterning to partition the electrically conductive region from the non-electrically conductive region is difficult to be precisely controlled. In addition, when a lead layer is formed on the electrically conductive layer containing silver nanowires using a metal layer of copper or silver, a problem may arise in that this metal layer is liable to be damaged.

SUMMARY

A light transmitting electrically conductive member of the comprises: a light transmitting base material; and an electrically conductive layer which includes an overcoat layer and silver nanowires embedded therein and which is provided on a surface of the light transmitting base material. The electrically conductive layer is partitioned into an electrically conductive region and a non-electrically conductive region having a high surface resistivity as compared to that of the electrically conductive region, and in the non-electrically conductive region, the silver nanowires embedded in the overcoat layer are at least partially iodized. A silver iodide is not exposed to a surface of the overcoat layer in the non-electrically conductive region, or the amount of a silver iodide exposed to the surface of the overcoat layer in the non-electrically conductive region is small as compared to the amount of silver nanowires exposed to a surface of the overcoat layer in the electrically conductive region.

In the disclosed light transmitting electrically conductive member, when the silver nanowires in the non-electrically conductive region are transformed into a silver iodide, the surface resistivity can be increased as compared to that of the electrically conductive region without significantly changing the light transmittance from that of the electrically conductive region. In the non-electrically conductive region, the silver iodide is not present on the surface of the overcoat layer, or even if the silver iodide is present thereon, the amount of the silver iodide is very small; hence, a white cloudy silver iodide is hardly present on the surface of the non-electrically conductive region, the haze in the non-electrically conductive region is reduced, and as a result, the transparency thereof can be maintained high.

In another aspect, a method for patterning a light transmitting electrically conductive member uses a light transmitting laminate material in which an electrically conductive layer including an overcoat layer and silver nanowires embedded therein is formed on a surface of a light transmitting base material. The method comprises:

covering a part of the electrically conductive layer with a resist layer;

treating a surface of the electrically conductive layer which is not covered with the resist layer using an iodine solution to at least partially iodize the silver nanowires; and applying a thiosulfate solution to the surface of the electrically conductive layer which is not covered with the resist layer to remove a silver iodide exposed to a surface of the overcoat layer.

The iodine solution is preferably an iodine-potassium iodine solution, and the concentration of iodine and the concentration of potassium iodine in the solution are preferably 0.05 to 1.0 percent by mass and 0.1 to 5.0 percent by mass, respectively.

DESCRIPTION OF THE EXEMPLARY EMBODIMENTS

Figure 1:
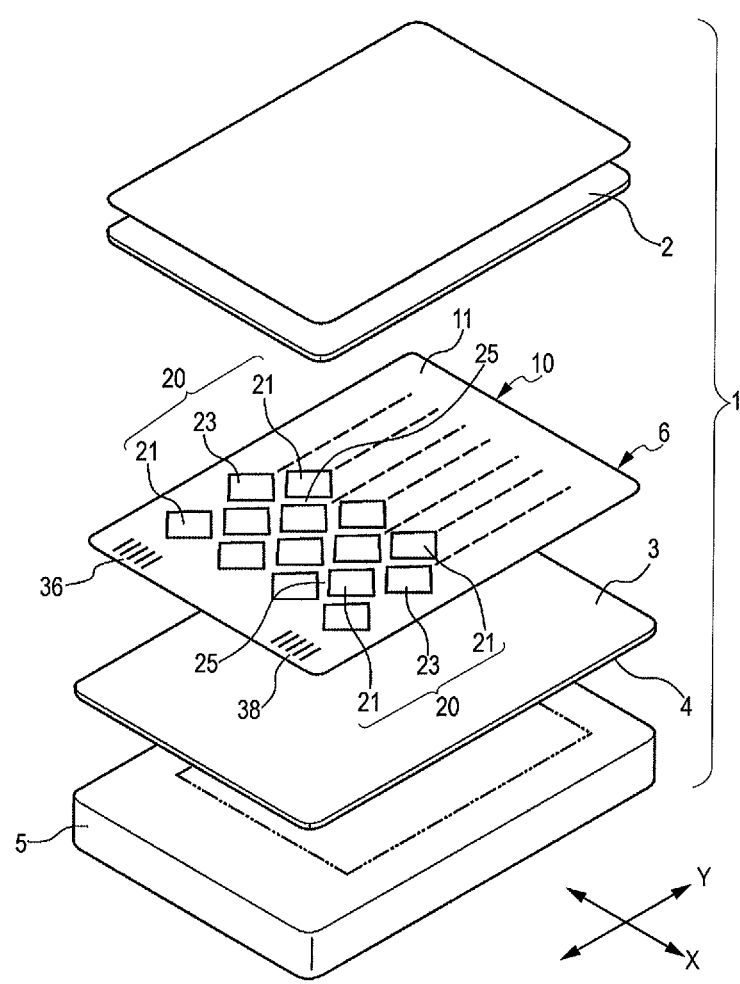
FIG. 1 is an exploded perspective view showing a mobile electronic apparatus mounting a light transmitting electrically conductive member of an embodiment of the present invention.

An electronic apparatus 1 shown in FIG. 1 is a mobile electronic apparatus and is used as an information communication terminal or a mobile phone or as a mobile game machine, a mobile navigation device, or the like. The electronic apparatus 1 includes an input panel 6 and a display panel 5 in combination.

The display panel 5 is a color liquid crystal panel having a backlight or an electroluminescent display element. A rear side film 3 formed of a PET or the like is adhered to the rear side of the input panel 6. An ITO layer 4 is provided over the entire surface of the rear side film 3 and is set to a ground potential. On a front side of the input panel 6, a light transmitting cover panel 2 is fitted.

The input panel 6 is an electrostatic touch panel, which is able to detect an input coordinate position by the change in electrostatic capacity. The input panel 6 is formed from a light transmitting electrically conductive member 10 shown in FIG. 4. The light transmitting characteristic of this specification indicates not only a pure transparent characteristic but also indicates, for example, a characteristic having a total light transmittance of 80% or more.

Figure 4:
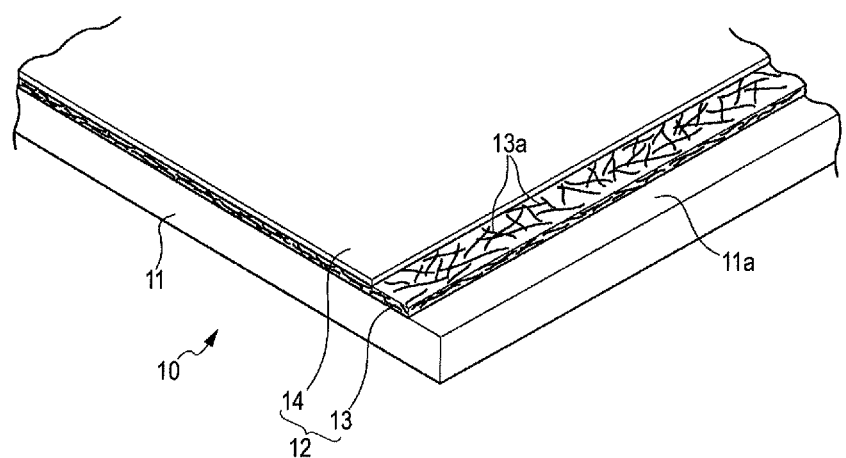
FIG. 4 is a perspective view showing a basic structure of the light transmitting electrically conductive member.

The light transmitting electrically conductive member 10 shown in FIG. 4 has a light transmitting base film 11. The base film 11 is a light transmitting film, such as a poly (ethylene terephthalate) (PET) film, a polycarbonate (PC) film, or a cycloolefin polymer (COP) film. In addition, a light transmitting plate material other than the film may also be used. On a surface 11a of the base film 11, a light transmitting electrically conductive layer 12 is formed. The electrically conductive layer 12 is formed so that a silver nanowire network 13 which is an aggregate of silver nanowires 13a is laminated on the surface 11a, and a light transmitting overcoat layer 14 formed of an acrylic-based material or the like is provided over the network 13.

Figure 5A:
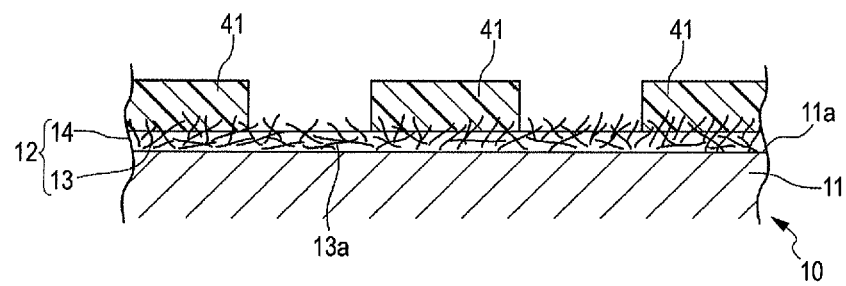
FIGS. 5A to 5C are views each showing a method for patterning the light transmitting electrically conductive member.
Figure 5B:
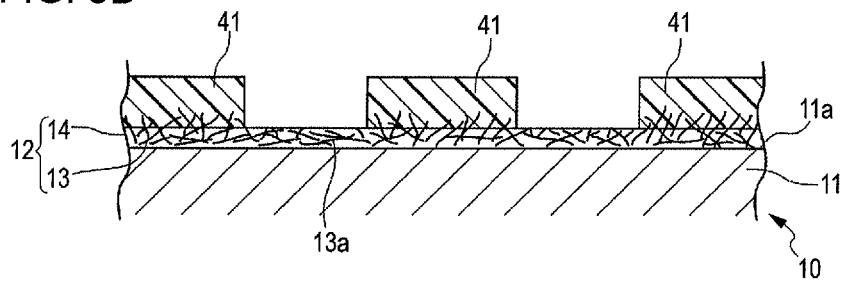
Figure 5C:
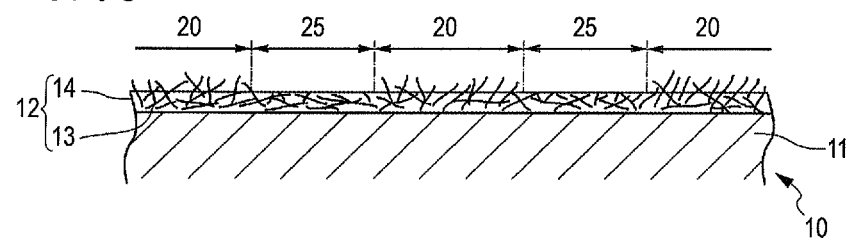

On the surface 11a of the base film 11, the silver nanowire network 13 is disposed, and an acrylic-based resin in a molten state is supplied thereon to form the overcoat layer 14; hence, as shown by a schematic cross-sectional structure in each of FIGS. 5A to 5C, the electrically conductive layer 12 has the structure in which in the overcoat layer 14 functioning as a light transmitting resin layer, the silver nanowires 13a are embedded. In addition, as shown by an exaggerated cross-section in FIG. 5A, the silver nanowire network 13 is partially projected from and exposed to the surface of the overcoat layer 14 so as to reduce the contact resistance between the electrically conductive layer 12 and a metal layer to be formed thereon.

The thickness of the base film 11 is approximately 50 to 300 μm, and the thickness of the electrically conductive layer 12 is approximately 100 nm.

In the electrically conductive layer 12 of the light transmitting electrically conductive member 10, the silver nanowires 13a are transformed in a specific region into a non-electrically conductive region 25, and a region in which no transformation is performed functions as an electrically conductive region 20.

Figure 2:
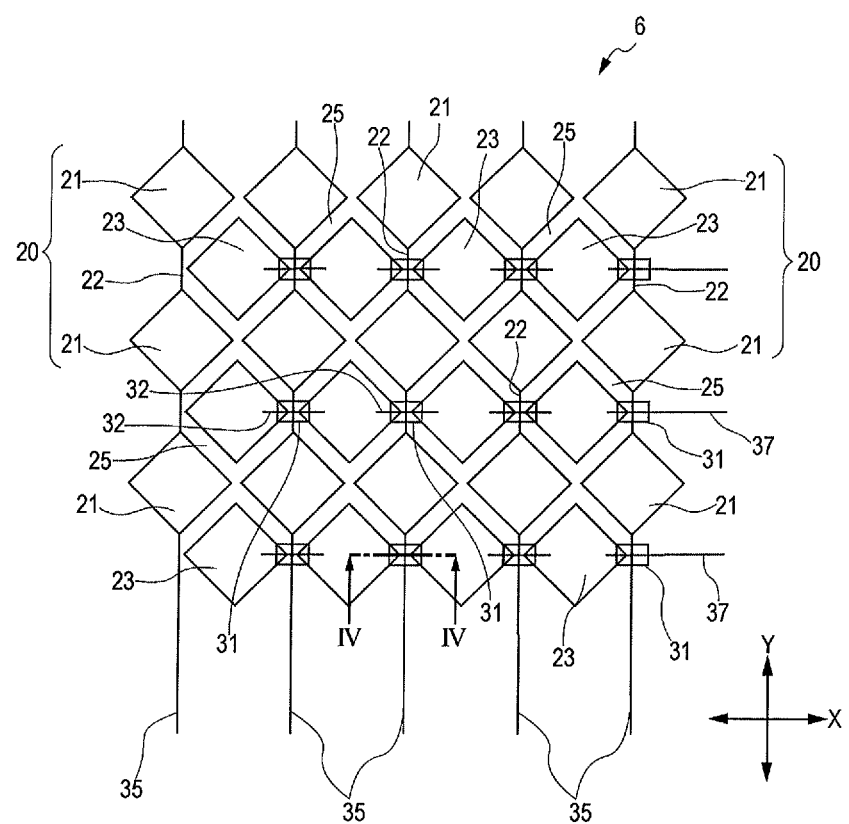
FIG. 2 is a plan view showing a pattern of an electrically conductive layer of the light transmitting electrically conductive member.
Figure 3:
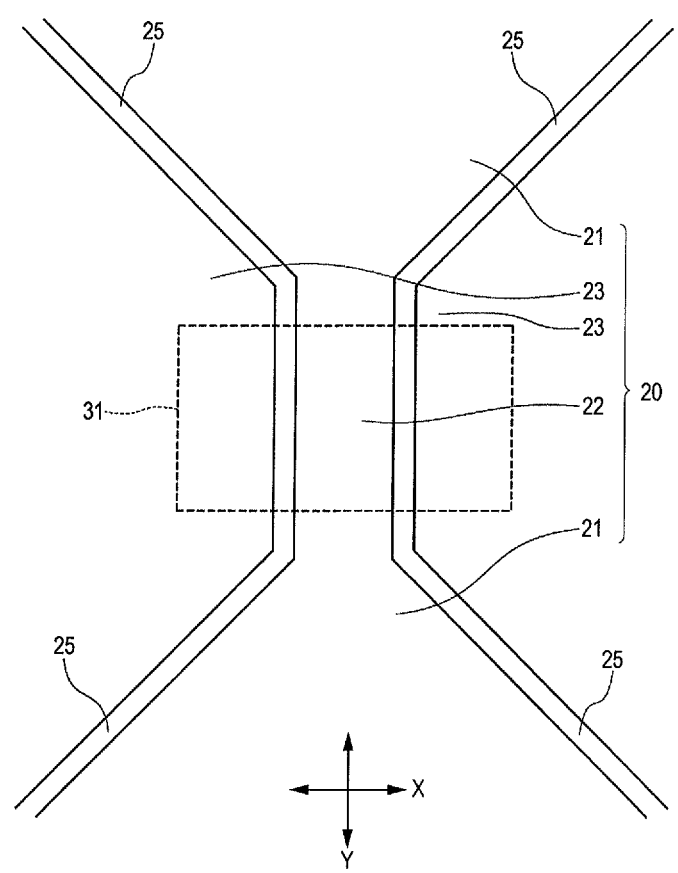
FIG. 3 is an enlarged view illustrating the pattern of the electrically conductive layer.

As shown in FIGS. 2 and 3, the electrically conductive region 20 is partitioned into first electrode portions 21, connection conductive portions 22, and second electrode portions 23.

As shown in FIG. 2, the first electrode portions 21 each have a square shape, a rhombic shape, or the like, and are arranged in a Y direction. A first electrode portion 21 and a first electrode portion 21 adjacent thereto in the Y direction are electrically connected to each other by a connection conductive portion 22 provided therebetween. The first electrode portions 21 and the connection conductive portions 22 are continuously formed.

The second electrode portion 23 is formed to have the same shape and the same area as those of the first electrode portion 21. However, the first electrode portion 21 may be formed to have a different shape and a different area from those of the second electrode portion 23 in some cases. The second electrode portions 23 are formed independently of each other so as to sandwich the connection conductive portions 22 therebetween and are linearly arranged in an X direction. The second electrode portion 23 is electrically separated from the first electrode portion 21 and the connection conductive portion 22 by the non-electrically conductive region 25 interposed therebetween.

On the surface of the input panel 6, as shown in FIGS. 2 and 3, over the connection conductive portion 22, the non-electrically conductive regions 25 located at the two sides thereof, and the second electrode portions 23 further provided at the two sides of the above non-electrically conductive regions 25, an organic insulating layer 31 is formed. The organic insulating layer 31 is formed of an acrylic-based light transmitting organic insulating material, such as a novolac resin. A bridge wire 32 is formed on the surface of the organic insulating layer 31, and by the bridge wires 32, the second electrode portions 23 arranged in the X direction are electrically connected to each other.

The bridge wire 32 is formed of a wire material, such as Cu, Ni, Ag, Au, or ITO. Alternatively, the bridge wire 32 is formed to have a monolayer using various types of alloy materials. In addition, the bridge wire 32 may also be formed using an electrically conductive laminate layer in which electrically conductive materials are laminated to each other. The bridge wire 32 is formed thin and narrow so as not be easily visually detected.

As shown in FIG. 2, a Y lead electrode layer 35 is connected to the first electrode portions 21 connected in the Y direction. As shown in FIG. 1, first land portions 36 are formed at a marginal portion of the input panel 6, and the Y lead electrode layers 35 are separately connected to the corresponding first land portions 36. The second electrode portions 23 connected by the bridge wires 32 in the X direction are connected to X lead electrode layers 37 in the corresponding lines. The X lead electrode layers 37 are separately connected to the corresponding second land portions 38.

In the input panel 6, although an electrostatic capacity is formed between the first electrode portion 21 and the second electrode portion 23, when a finger is brought into contact with the surface of the cover panel 2, an electrostatic capacity is formed between the finger and the first electrode portion 21 or the second electrode portion 23.

When a pulse drive electric power is sequentially applied to the first electrode portions 21 in each line, and current values detected from all the second electrode portions 23 are measured, the first electrode portion 21 which is closest to the finger can be calculated. In addition, when a pulse drive electric power is sequentially applied to the second electrode portions 23 in each line, and current values detected from all the first electrode portions 21 are measured, the second electrode portion 23 which is closest to the finger can be calculated.

In addition, according to the present invention, the input panel is not limited to a panel in which the first electrode portions 21 and the second electrode portions 23 are formed on the same surface of the base film 11 and may be a panel in which two films, that is, a film on which electrodes are sequentially provided in the X direction and a film on which electrodes are sequentially provided in the Y direction, are laminated to each other. Alternatively, a panel in which independent electrode portions are provided and are separately connected to the corresponding land portions may also be used.

Next, a method for patterning the electrically conductive layer 12 of the light transmitting electrically conductive member 10 into the electrically conductive region 20 and the non-electrically conductive region 25 will be described.

In FIG. 5A, a cross-sectional structure of the light transmitting electrically conductive member 10 before patterning is schematically shown. The electrically conductive layer 12 is provided on the surface 11a of the base film 11. In the electrically conductive layer 12, the silver nanowire network 13 is embedded in the overcoat layer 14. Although exaggeratedly shown in the drawing, the silver nanowires 13a are partially exposed to the surface of the overcoat layer 14.

On the electrically conductive layer 12, a positive type or a negative type photoresist, or a film resist is formed. The photoresist is formed by various types of methods, such as a spin coating method or a roll coating method, to have a thickness of approximately 1 to 5 μm. In the case in which the film resist is used, a resist having a thickness of approximately 20 μm is used. By the use of a mask and an exposure apparatus, the photoresist is partially exposed. In the following developing step, the exposed electrically conductive layer is developed with an alkaline solution such as tetramethylammonium hydroxide (TMAH), so that separated resist layers 41 remain as shown in FIG. 5A.

In the electrically conductive layer 12, the resist layers 41 are allowed to remain on portions to be formed into the electrically conductive regions 20 which form the first electrode portions 21, the connection conductive portions 22, and the second electrode portions 23, and a photoresist on a portion to be formed into the non-electrically conductive regions 25 is removed.

Next, a treatment is performed so that the electrically conductive layer 12, which is not covered with the resist layers 41 is changed to be non-electrically conductive.

For this treatment, an iodine solution is used. The iodine solution is preferably an iodine-iodine salt solution, such as an iodine-potassium iodine solution. The iodine-potassium iodine solution is a solution in which iodine is dissolved in a potassium iodine solution, and a solution containing 0.05 to 1.0 percent by mass of iodine and approximately 0.1 to 5.0 percent by mass of potassium iodine is preferably used.

When the light transmitting electrically conductive member 10 on which the resist layers 41 are formed is dipped in the iodine-potassium iodine solution for approximately 0.5 to 10 minutes, the solution permeates the inside of the overcoat layer 14 in a region which is not covered with the resist layers 41, and the silver nanowires 13a are at least partially iodized and transformed into a silver iodide.

In the region which is not covered with the resist layers 41, since the silver nanowires 13a are iodized, the surface resistivity of the electrically conductive layer 12 in the region described above is increased, and a non-electrically conductive region 25 which exhibits substantially an electrically insulating function is formed.

However, when the non-electrically conductive treatment is performed using an iodine-potassium iodine solution, in the region which is formed into the non-electrically conductive region 25, the silver nanowires exposed to the surface of the overcoat layer 14 is iodized, and as a result, a white cloudy or a whitened metal compound is generated.

Accordingly, in the following step, by the use of a thiosulfate solution, the white cloudy or whitened metal compound, such as a silver iodide, on the surface of the overcoat layer 14 is removed. As the thiosulfate solution, a sodium thiosulfate solution at a concentration of 1.0 to 25 percent by mass is preferably used. When the light transmitting electrically conductive member covered with the resist layers 41 is dipped in the solution for approximately 10 to 60 seconds, the metal compound, such as a silver iodide, exposed to the surface of the overcoat layer 14 can be removed.

When the resist layers 41 are removed using a resist stripper, as shown in FIG. 5C, the electrically conductive layer 12 is partitioned into the electrically conductive regions 20 and the non-electrically conductive regions 25. As shown in FIGS. 2 and 3, by the electrically conductive regions 20, the first electrode portions 21, the connection conductive portions 22, and the second electrode portions 23 are formed.

Since containing a silver iodide, the non-electrically conductive region 25 has a non-electrical conductivity, or the surface resistivity thereof is significantly higher than that of the electrically conductive region 20. In the non-electrically conductive region 25, since iodized silver nanowires are allowed to remain in the overcoat layer 14, the difference in optical characteristics from those of the electrically conductive region 20 in which the silver nanowires are present is reduced. Hence, between the electrically conductive region 20 and the non-electrically conductive region 25, a significant difference in transmission characteristics of display light emitted from the display panel 5 may not be generated.

In the non-electrically conductive region 25, a silver iodide generated on the surface of the overcoat layer 14 is removed. Alternatively, the amount of a silver iodide generated on the surface of the overcoat layer 14 is significantly reduced as compared to the amount of the silver nanowires 13a exposed to the surface of the overcoat layer 14 in the electrically conductive region 20.

In the patterning method described above, the iodizing treatment of the silver nanowires 13a using an iodine solution and the removal treatment of the white cloudy metal compound, such as a silver iodide, using a thiosulfate solution are performed in different steps. For example, when the above treatments are simultaneously performed using a mixed solution containing an iodine solution and a thiosulfate solution, the silver nanowires in the overcoat layer are dissolved, and as a result, the optical characteristics of the non-electrically conductive region are seriously changed. However, in the method described above, since the two treatment steps are separately performed, while iodized silver nanowires are allowed to remain in the overcoat layer, the metal compound, such as a silver iodide, on the surface of the overcoat layer can be removed, and hence, the difference in optical characteristics between the electrically conductive region in which the silver nanowires are present and the non-electrically conductive region can be reduced.

EXAMPLES

Example

Figure 6:
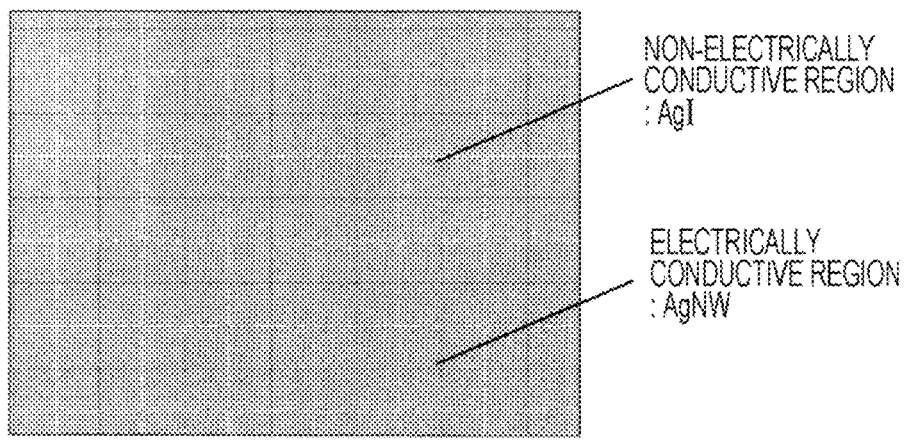
FIG. 6 is a view illustrating one example.

By the use of a light transmitting electrically conductive member 10 in which an electrically conductive layer 12 formed of a silver nanowire network 13 and an acrylic-based overcoat layer 14 and having a thickness of approximately 100 nm was formed on a surface of a PET film, as shown in FIG. 6, an electrically conductive region and a non-electrically conductive region were patterned.

In an iodizing treatment of the silver nanowires, dipping was performed for 120 seconds in an iodine-potassium iodine solution containing 0.1 percent by mass of iodine and 0.5 percent by mass of potassium iodine. In a removal treatment of a metal compound, such as a silver iodide, remaining on the surface of the overcoat layer 14, dipping was performed for 30 seconds in a sodium thiosulfate solution at a concentration of 10 percent by mass.

Comparative Example

By the use of a light transmitting electrically conductive member 10 formed in the same manner as that of Example, a region having the same area as that of the non-electrically conductive region shown in FIG. 6 was etched using an aqua regia-based etchant to dissolve the silver nanowires in the overcoat layer 14, and the electrically conductive member thus processed was used as Comparative Example.

In the following Table 1, the optical characteristics of Example are compared to those of Comparative Example.

In Example of Table 1, the haze and the total light transmittance of the electrically conductive layer before the treatment, that is, the electrically conductive region, are compared to the haze and the total light transmittance of the non-electrically conductive region obtained by the treatment using an iodine-potassium iodine solution and the treatment using a thiosulfate solution.

In Comparative Example of Table 1, the haze and the total light transmittance of the electrically conductive layer before the treatment, that is, before the etching, are compared to the haze and the total light transmittance of the region obtained by etching the silver nanowires using an aqua regia-based etchant.

In Example, it is found that between the electrically conductive region and the non-electrically conductive region, a significant difference in total light transmittance is not generated. It is found that in Example, although the haze in the non-electrically conductive region is decreased as compared to that in the electrically conductive region, the haze in the non-electrically conductive region is significantly superior to that of the region obtained by removing the silver nanowires in Comparative Example.

In addition, in Example, the optical contrast between the electrically conductive region and the non-electrically conductive region is as shown in FIG. 6.

TABLE 1

| | AgNW ETCHANT | FILM CONDITIONS | OPTICAL CHARACTERISTICS | |
|---|---|---|---|---|
| | | | HAZE | LIGHT TRANSMITTANCE (%) |
| COMPARATIVE EXAMPLE | AQUA REGIA BASE | BEFORE ETCHING AFTER ETCHING | 0.95 0.25 | 89.92 92.08 |
| EXAMPLE | IODINE BASE | BEFORE TREATMEMT AFTER TREATMENT | 0.92 0.75 | 89.79 90.15 |

What is claimed is:

1. A light transmitting electrically conductive member comprising:
    a light transmitting base material; and
    an electrically conductive layer which includes an overcoat layer and silver nanowires included therein and which is provided on a surface of the light transmitting base material and the electrically conductive layer having an amount of silver iodide formed by iodizing the silver nanowires,
    wherein the electrically conductive layer is partitioned into an electrically conductive region and a non-electrically conductive region having a high surface resistivity compared to that of the electrically conductive region, wherein the amount of silver iodide in the overcoat layer comprises the non-electrically conductive region, and the silver nanowires are partially exposed to surface of the overcoat layer in the electrically conductive region, and
    wherein the silver iodide formed by iodizing the silver nanowires is not exposed to the surface of the overcoat layer in the non-electrically conductive region.

2. The light transmitting electrically conductive member according to claim 1, wherein the overcoat layer is made of light transmitting resin.

3. The light transmitting electrically conductive member according to claim 1, wherein the overcoat layer is made of an acrylic-based resin.

4. A light transmitting electrically conductive member comprising:
    a light transmitting base material; and
    an electrically conductive layer which includes an overcoat layer and silver nanowires included therein and which is provided on a surface of the light transmitting base material and the electrically conductive layer having an amount of a silver iodide formed by iodizing the silver nanowires, wherein the electrically conductive layer is partitioned into an electrically conductive region and a non-electrically conductive region having a high surface resistivity as compared to that of the electrically conductive region, wherein the amount of silver iodide in the overcoat layer comprises the non-electrically conductive region, and wherein and the silver nanowires are partially exposed to a surface of the overcoat layer in the electrically conductive region; and wherein the amount of a silver iodide exposed to the surface of the overcoat layer in the non-electrically conductive region is small compared to the amount of silver nanowires exposed to the surface of the overcoat layer in the electrically conductive region.

5. The light transmitting electrically conductive member according to claim 4, wherein the overcoat layer is made of light transmitting resin.

6. The light transmitting electrically conductive member according to claim 4, wherein the overcoat layer is made of an acrylic-based resin.

7. A method for patterning a light transmitting electrically conductive member, the method using a light transmitting laminate material in which an electrically conductive layer including an overcoat layer and silver nanowires included therein is formed on a surface of a light transmitting base material, and the method comprising:

covering a part of the electrically conductive layer with a resist layer;

treating a surface of the electrically conductive layer which is not covered with the resist layer using an iodine solution to at least partially iodize the silver nanowires to form silver iodide; and applying a thiosulfate solution to the surface of the electrically conductive layer which is not covered with the resist layer to remove at least some of the silver iodide exposed on a surface of the overcoat layer and wherein the silver iodide formed from the silver nanowires remains in the overcoat layer.

8. The method for patterning a light transmitting electrically conductive member according to claim 7, wherein the iodine solution is an iodine-potassium iodine solution.

9. The method for patterning a light transmitting electrically conductive member according to claim 8, wherein in the iodine-potassium iodine solution, the concentration of iodine is 0.05 to 1.0 percent by mass, and the concentration of potassium iodine is 0.1 to 5.0 percent by mass.

10. The method for patterning a light transmitting electrically conductive member according to claim 7, wherein the thiosulfate solution is a sodium thiosulfate solution.

11. The method for patterning a light transmitting electrically conductive member according to claim 10, wherein the concentration of sodium thiosulfate is 1.0 to 25 percent by mass.

12. The method of patterning a light transmitting electrically conductive member according to claim 7, wherein the overcoat layer is made of a light transmitting resin.

13. The method of patterning a light transmitting electrically conductive member according to claim 7, wherein the overcoat layer is made of a light transmitting resin.

14. A light transmitting electrically conductive member comprising:

a light transmitting base material; and an electrically conductive layer which includes an overcoat layer and silver nanowires included therein which is provided on a surface of the light transmitting base material, and the electrically conductive layer having nanowires of silver iodide formed by iodizing the silver nanowires;

wherein the electrically conductive layer is partitioned into an electrically conductive region and a non-electrically conductive region having a high surface resistivity compared to that of the electrically conductive region, and wherein the silver nanowires are partially exposed to a surface of the overcoat layer in the electrically conductive region, and nanowires of silver iodide are included in the overcoat layer in the non-electrically conductive region, and the nanowires of silver iodide are not exposed to a surface of the overcoat layer in the non-electrically conductive region.

15. The light transmitting electrically conductive member according to claim 14, wherein the overcoat layer is made of light transmitting resin.

16. The light transmitting electrically conductive member according to claim 14, wherein the overcoat layer is made of an acrylic-based resin.

17. A light transmitting electrically conductive member comprising:

a light transmitting base material; and an overcoat layer provided on a surface of the light transmitting base material, wherein the overcoat layer is partitioned into an electrically conductive region and a non-electrically conductive region having a high surface resistivity as compared to that of the electrically conductive region, wherein the electrically conductive region of the overcoat layer includes silver nanowires, and wherein the non-electrically conductive region of the overcoat layer includes nanowires of silver iodide formed by iodizing the silver nanowires, and wherein the silver nanowires are partially exposed to a surface of the overcoat layer in the electrically conductive region, and the nanowires of silver iodide are not exposed to a surface of the overcoat layer in the non-electrically conductive region.

18. The light transmitting electrically conductive member according to claim 17, wherein the overcoat layer is made of light transmitting resin.

19. The light transmitting electrically conductive member according to claim 17, wherein the overcoat layer is made of an acrylic-based resin.

20. A light transmitting electrically conductive member comprising:

a light transmitting base material; and an electrically conductive layer which includes an overcoat layer and silver nanowires included therein and which is provided on a surface of the light transmitting base material and the electrically conductive layer having nanowires of silver iodide formed by iodizing the silver nanowires, wherein the electrically conductive layer is partitioned into an electrically conductive region and a non-electrically conductive region having a high surface resistivity as compared to that of the electrically conductive region, and wherein the nanowires of silver iodide are included in the overcoat layer in the non-electrically conductive region, and the silver nanowires are partially exposed to a surface of the overcoat layer in the electrically conductive region, and wherein the amount of nanowires of silver iodide exposed to the surface of the overcoat layer in the non-electrically conductive region is small as compared to the amount of silver nanowires exposed to a surface of the overcoat layer in the electrically conductive region.

21. The light transmitting electrically conductive member according to claim 20, wherein the overcoat layer is made of light transmitting resin.

22. The light transmitting electrically conductive member according to claim 20, wherein the overcoat layer is made of an acrylic-based resin.

23. A light transmitting electrically conductive member comprising:
   a light transmitting base material; and
   an overcoat layer provided on a surface of the light transmitting base material and,
   wherein the overcoat layer is partitioned into an electrically conductive region and a non-electrically conductive region having a high surface resistivity as compared to that of the electrically conductive region, and
   wherein the electrically conductive region of the overcoat layer includes nanowires of silver, and the non-electrically conductive region of the overcoat layer includes nanowires of silver iodide formed by iodizing the silver nanowires, and
   wherein the silver nanowires are partially exposed to a surface of the overcoat layer in the electrically conductive region, and the amount of nanowires of silver iodide exposed to the surface of the overcoat layer in the non-electrically conductive region is small compared to the amount of silver nanowires exposed to a surface of the overcoat layer in the electrically conductive region.

24. The light transmitting electrically conductive member according to claim 23, wherein the overcoat layer is made of light transmitting resin.

25. The light transmitting electrically conductive member according to claim 23, wherein the overcoat layer is made of an acrylic-based resin.

* * * * *